(12) United States Patent
Farooq et al.

(10) Patent No.: US 6,541,305 B2
(45) Date of Patent: Apr. 1, 2003

(54) SINGLE-MELT ENHANCED RELIABILITY SOLDER ELEMENT INTERCONNECT

(75) Inventors: Mukta G. Farooq, Hopewell Junction, NY (US); Raymond A. Jackson, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/892,806

(22) Filed: Jun. 27, 2001

(65) Prior Publication Data

US 2003/0003624 A1 Jan. 2, 2003

(51) Int. Cl.[7] .......................... H01L 21/44; H01L 21/30
(52) U.S. Cl. ...................................... 438/108; 438/455
(58) Field of Search ............................. 438/106, 108, 438/109, 107, 117, 455, 457

(56) References Cited

U.S. PATENT DOCUMENTS

| | | | |
|---|---|---|---|
| 3,871,014 A | | 3/1975 | King et al. |
| 3,871,015 A | | 3/1975 | Lin et al. |
| 5,147,084 A | | 9/1992 | Behun et al. |
| 5,186,383 A | | 2/1993 | Melton et al. |
| 5,284,796 A | * | 2/1994 | Nakanishi et al. .......... 437/183 |
| 5,700,715 A | | 12/1997 | Pasch |
| 5,895,554 A | | 4/1999 | Gordon |
| 5,956,606 A | * | 9/1999 | Burnette ..................... 438/615 |
| 6,127,253 A | * | 10/2000 | Roldan et al. ............... 438/612 |
| 6,184,062 B1 | * | 2/2001 | Brofman et al. ............ 438/106 |
| 6,246,548 B1 | * | 6/2001 | Williams ................. 360/245.8 |
| 6,267,823 B1 | * | 7/2001 | Yamaguchi et al. .......... 148/24 |
| 6,283,359 B1 | * | 9/2001 | Brofman et al. ....... 228/180.22 |

FOREIGN PATENT DOCUMENTS

JP  3-30349  2/1991

OTHER PUBLICATIONS

Galloway et al., IBM Technical Disclosure Bulletin, Stand–Offs for Chip Alignment as Well as Controlled Collapse in Chip Joining; vol. 23, No. 5, pp. 2156–2158 (Oct. 1980).*

Foster, IBM technical Disclosure Bulletin, Area Array Substrate–to–Carrier Interconnection Using Corner Standoff; vol. 29, No. 11, pp. 4736–4737 (Apr. 1987).*

Coombs, IBM Technical Disclosure Bulletin entitled, Chip Mounting with Prestretched Joints; vol. 16, No. 3, p. 767 (Aug. 1973).

Aakalu, IBM Technical Disclosure Bulletin entitled, Modular Cap Mounting; vol. 22, No. 3, p. 1064 (Aug. 1979).

Galloway, IBM Technical Disclosure Bulletin entitled, Stand–Offs for Chip Alignment as Well as Controlled Collapse in Chip Joining; vol. 23, No. 5, pp. 2156–2158 (Oct. 1980).

Darrow, IBM Technical Disclosure Bulletin entitled, PIN Support for IC Chip to Prevent C4 Collapse During Reflow; vol. 30, No. 11, pp. 320–321 (Apr. 1988).

Foster, IBM Technical Disclosure Bulletin entitled, Area Array Substrate–to–Carrier Interconnection Using Corner Standoff; vol. 29, No. 11, pp. 4736–4737 (Apr. 1987).

* cited by examiner

*Primary Examiner*—Kamand Cuneo
*Assistant Examiner*—Scott B. Geyer
(74) *Attorney, Agent, or Firm*—Ira D. Blecker

(57) ABSTRACT

A method of joining first and second substrates through a solder element interconnect, the method including the steps of forming solder elements, such as solder balls, in a first array on a first substrate, forming pads of solder paste in a second array on a second substrate wherein the first and second arrays are mirror images of one another, establishing a standoff element on one of the first or second substrates, assembling the first and second substrates such that each of the solder elements on the first substrate are embedded in each of the solder paste pads and the standoff element is interposed between the first and second substrates, heating the first and second substrates at a preferred temperature to cause melting of the solder elements and the solder pads into single solder elements, wherein the standoff controls the separation distance between the first and second substrates.

14 Claims, 3 Drawing Sheets

SINGLE-MELT ENHANCED RELIABILITY SOLDER ELEMENT INTERCONNECT

BACKGROUND OF THE INVENTION

The present invention relates to the field of ball grid array interconnects and, more particularly, relates to ball grid array interconnects formed from single-melt solders having enhanced reliability.

In the electronics industry, it is known to mount an integrated circuit component to a ceramic or organic substrate by various means including wire bonds and so-called controlled collapse chip connections also known as C-4s. The wire bonds and C-4s not only provide the physical connection but also electrically connect electrical circuits on the integrated circuit component to appropriate electrical circuits on the ceramic or organic substrate. The mounting of the integrated circuit component on the ceramic or organic substrate is called first level packaging.

When using C-4s, it is useful to prevent the integrated circuit component from totally collapsing onto the ceramic or organic substrate. The reason for this is that the taller the joint height, the greater the fatigue resistance. One way to accomplish this is to have standoffs between the integrated circuit component and the ceramic or organic substrate. The prior art is replete with many solutions for providing such standoffs.

King et al. U.S. Pat. No. 3,871,014, the disclosure of which is incorporated by reference herein, discloses a flip-chip connection to a substrate in which the connection solder balls are non-uniform in shape. The result is that some of the solder balls act as standoffs to increase the joint height.

Lin et al. U.S. Pat. No. 3,871,015, the disclosure of which is incorporated by reference herein, discloses a flip-chip connection with non-uniform solder balls as was disclosed in King et al. above but, in addition, in FIG. 5 discloses some of the standoffs to be copper balls.

Melton et al. U.S. Pat. No. 5,186,383, the disclosure of which is incorporated by reference herein, discloses the joining of an integrated circuit component to a substrate. The integrated circuit component has solder balls of a high melt composition. The substrate has pads of low melt solder. During joining of the integrated circuit component to the substrate, the assembly is heated to a temperature above the low melt solder but less than the high melt solder. The interaction of the low melt solder on the high melt solder causes the high melt solder to liquify at the junction of the low melt and high melt solder, thereby causing the solder balls to locally collapse. However, certain of the solder balls on the integrated circuit component do not have matching solder pads on the substrate so these solder balls do not liquify and collapse, thereby providing standoffs which control the collapse of the solder joint between the integrated circuit component and the substrate.

Nakanishi et al. U.S. Pat. No. 5,284,796, the disclosure of which is incorporated by reference herein, discloses a flip-chip joining process for connecting an integrated circuit component to a substrate. Connections between the integrated circuit component and the substrate are formed by mirror image solder bumps on the integrated circuit component and the substrate. Collapse of the joint is controlled by stud bumps at the edges of the integrated circuit component which are removed after the integrated circuit component has been joined to the substrate.

Pasch et al. U.S. Pat. No. 5,700,715, the disclosure of which is incorporated by reference herein, discloses a flip-chip connection to a substrate in which pillars are utilized to provide separation between the integrated circuit component and the substrate.

Gordon U.S. Pat. No. 5,895,554, the disclosure of which is incorporated by reference herein, discloses an alignment apparatus for use during the mounting of electronic components. Part of the function of the alignment apparatus is to control the collapse of the solder joint between the electronic components.

Ochiai Japanese Patent Application 3-30349, the disclosure of which is incorporated by reference herein, discloses the joining of a chip to a substrate. In one embodiment shown in FIG. 1, a chip and a substrate having mirror image solder bumps are joined together. Rubber spacers are utilized to keep the solder joint between the chip and substrate from collapsing. In a second embodiment shown in FIG. 2, solder bumps are initially formed only on the chip. Rubber spacers again keep the solder joint from collapsing.

Coombs IBM Technical Disclosure Bulletin, 16, No. 3, p.767 (August 1973), the disclosure of which is incorporated by reference herein, discloses solder pillars on a chip which are joined to solder deposits on a substrate. A shouldered pin controls the joint distance between the chip and substrate.

Aakalu IBM Technical Disclosure Bulletin, 22, No. 3, p.1064 (August 1979), the disclosure of which is incorporated by reference herein, discloses the use of solder spacers to control the spacing between a cap and a ceramic substrate.

Galloway et al. IBM Technical Disclosure Bulletin, 23, No. 5, pp.2156–2158 (October 1980), the disclosure of which is incorporated by reference herein, discloses a flip-chip arrangement for mounting a chip on a substrate wherein standoffs of a different alloy material than the solder used to join the chip to the substrate are utilized to maintain a controlled distance between the chip and the substrate.

Darrow et al. IBM Technical Disclosure Bulletin, 30, No. 11, pp. 320–321 (April 1988), the disclosure of which is incorporated by reference herein, discloses the joining of a chip to a ceramic substrate wherein support pins control the height of the solder joint between the chip and the ceramic substrate.

Once the integrated circuit component has been joined to the ceramic or organic substrate, the ceramic or organic substrate is usually joined to a second substrate, usually an organic card, to form the second level of packaging. In one preferred method of joining, solder balls on the bottom of the ceramic or organic substrate are joined to mirror image solder balls or pads (which also may be solder-coated) on the second substrate to form a ball grid array, hereafter "BGA", such as that disclosed in Behun et al. U.S. Pat. No. 5,147, 084, the disclosure of which is incorporated by reference herein.

As with the joining of an integrated circuit component to a substrate, increasing the joint height of a BGA is desirable to increase fatigue resistance and reliability.

For example, Foster IBM Technical Disclosure Bulletin, 29, No. 11, pp. 4736–4737 (April 1987), the disclosure of which is incorporated by reference herein, discloses the joining of a ceramic substrate to an organic carrier in which the height of lead/tin eutectic solder joints between the ceramic substrate and organic carrier is controlled by standoffs so as to optimize the fatigue resistance of the joint and maximize reliability.

However, two problems make BGA interconnections more problematical. The first is that the two substrates to be joined are often not flat. One or both substrates may have substantial camber such that it is difficult to make all of the solder connections between the two substrates. The second is that there is considerable interest in going to a lead-free joining solution. While various lead-free solders are known, there is no readily available solder hierarchy given the temperature limitations of an organic carrier so that the low melt/high melt solders methodology often utilized in the aforementioned BGA cannot be used with lead-free solders. The result is that a single-melt solder system must be used which necessitates some method of preventing collapse of the solder joint.

It is, accordingly, one purpose of the present invention to have a BGA interconnection which accommodates camber in the substrates to be joined.

It is another purpose of the present invention to have a BGA interconnection with a single melt solder system and a means to control the height of the solder joint.

It is another purpose of the present invention to have a BGA interconnection with a single melt solder system where the initial height of the solder element as attached to a first substrate is at least equal to, or greater than, the diameter of the single melt solder ball before attachment.

It is yet another purpose of the present invention to have a BGA interconnection with a lead-free solder system.

These and other purposes of the present invention will become more apparent after referring to the following description considered in conjunction with the accompanying drawings.

BRIEF SUMMARY OF THE INVENTION

The purposes of the invention have been achieved by providing, according to a first aspect of the present invention, a method of joining first and second substrates through a solder element interconnect, the method comprising the steps of:

forming a plurality of solder elements in a first array on a first substrate;

forming a plurality of pads of solder paste in a second array on a second substrate wherein the first and second arrays are mirror images of one another;

establishing at least one standoff element on one of the first or second substrates;

assembling the first and second substrates such that each of the solder elements on the first substrate are embedded in each of the solder paste pads and the at least one standoff element is interposed between the first and second substrates;

heating the first and second substrates at a predetermined temperature to cause melting of the plurality of solder elements and the plurality of solder pads into single solder elements, the at least one standoff controlling the separation distance between the first and second substrates.

According to a second aspect of the present invention, there is provided a method of joining first and second substrates through a solder element interconnect, the method comprising the steps of:

obtaining a heat resistant boat having a plurality of cavities wherein each of the cavities has a first portion sized to receive a quantity of solder and a second portion narrower in cross section than the first portion;

placing a quantity of solder in each of the first portion of the cavities;

placing the first substrate in juxtaposition with the heat resistant boat so that the first substrate contacts each of the quantities of solder;

clamping the first substrate to the heat resistant boat;

heating the first substrate, heat resistant boat and quantities of solder so as to reflow the solder, the quantities of solder joining with the first substrate while also being forced into the second portion of each of the cavities so as to form a plurality of elongated solder elements in a first array on the first substrate;

forming a plurality of pads of solder paste in a second array on a second substrate wherein the first and second arrays are mirror images of one another;

establishing at least one standoff element on one of the first or second substrates;

assembling the first and second substrates such that each of the solder elements on the first substrate are embedded in each of the solder paste pads and the at least one standoff element is interposed between the first and second substrates;

heating the first and second substrates at a predetermined temperature to cause melting of the plurality of solder elements and the plurality of solder pads into single solder elements, the at least one standoff controlling the separation distance between the first and second substrates.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Referring to the Figures in more detail, and particularly referring to FIGS. 1A to 1D, there is disclosed a first process for practicing the present invention.

Figure 1A:
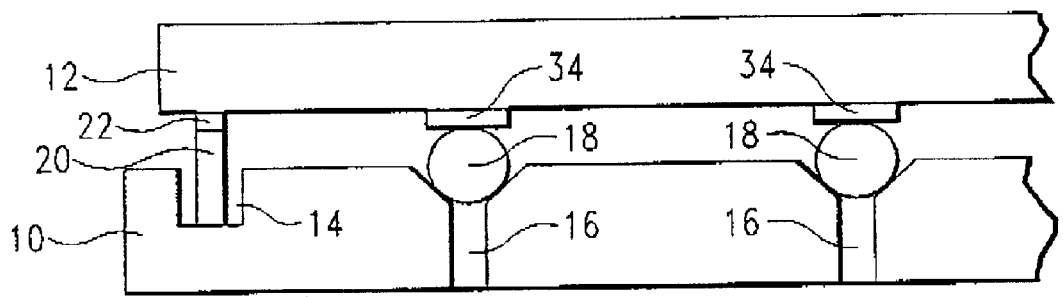
FIGS. 1A to 1D illustrate a first embodiment according to the present invention.

As shown first in FIG. 1A, a graphite boat, or any other heat resistant boat, is loaded with standoff 20 in cavity 14 and solder balls 18 in cavities 16. Standoff 20 has a quantity of fusible material 22. After standoff 20 and solder balls 18 are loaded into the graphite boat, first substrate 12 is placed into contact, and clamped or forced down if necessary, with the fusible material 22 of standoff 20 and solder balls 18. The graphite boat 10 and first substrate 12 should be aligned (such as by an optical alignment system) so that solder balls 18 align with pads 34 of first substrate 12. If desired, pads 34 may be coated with gold to facilitate bonding of the solder balls 18 to the pads 34. While only one standoff 20 is shown in FIG. 1A, there will usually be a plurality of such standoffs. As one example, there could be four standoffs, one for each corner of the first substrate. Similarly, while only two solder balls 18 are shown, there are usually many more as is well known in the art.

While the advantages of the present invention can be attained with any solder material including lead-containing solders, the present invention has particularly applicability to lead-free solders. Thus, for purposes of the present invention, fusible material 22 may be, for example, tin or tin alloy. Standoff 20 itself could be made from copper or a high melting solder material, preferably also lead-free, such as a tin/copper alloy. If standoffs 20 comprise a high melting solder material, fusible material 22 may optionally be disposed of and the standoffs 20 may be joined directly to the first substrate at the same time that solder balls 18 are reflowed. Solder balls 18 could be any of the known lead-free solders including tin/silver alloys, tin/silver/copper alloys, tin/silver/bismuth alloys, tin/silver/bismuth/copper alloys, tin/antimony alloys and tin/bismuth alloys. One particularly preferred lead-free solder is, in weight percent, 3.5% silver, 0.7% copper, remainder tin.

The assembly shown in FIG. 1A is then placed in a furnace at an appropriate temperature to cause reflow of fusible material 22 and solder balls 18. Furnace conditions will, of course, depend on the solder composition. Generally speaking the assembly should be heated in the temperature range of 220–300° C. for at least two minutes. A suitable ambient, such as nitrogen at a flow rate of 20 to 80 liters/minute, should be provided.

After reflow and removal from the graphite boat 10, first substrate 12 has reflowed solder balls 32 and standoff 20 attached by fusible material 22. Reflowed solder balls 32 are slightly rounded as they will conform to cavities 16 during reflow. As one example of this first embodiment of the present invention, pads 34 on first substrate 12 have a diameter of approximately 0.035 inches, solder balls 18 have a diameter of approximately 0.035 inches while reflowed solder balls 32 have a height (extending from pads 34) of approximately 0.027–0.029 inches. Cleaning of first substrate 12, standoff 20 and reflowed solder balls 32 is performed as appropriate.

Second substrate 26 is prepared by screening or otherwise depositing solder paste 30 onto pads 28. Similarly as noted above, the solder paste 30 can be a leaded or lead-free solder paste, preferably lead-free. Preferably, the metallic part of solder paste 30 should have the same composition as reflowed solder balls 32. Alternatively, the metallic part of solder paste 30 could be different from the composition of reflowed solder balls 32 just so long as the respective solder materials are compatible from the standpoints of reflow temperature, fatigue resistance, corrosion resistance, etc. The solder paste 30 applied should be on the order of 0.006 to 0.012 inches in thickness. The exact amount of paste could be deterred by routine experimentation and is dependent on the metal content of the paste system the size of the pack, the pitch of the pads and the maximum non-flatness (i.e., camber) of the first substrate 12.

Figure 1B:
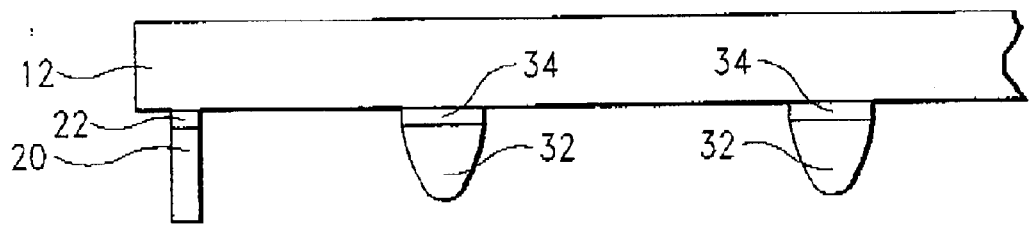
Figure 1C:
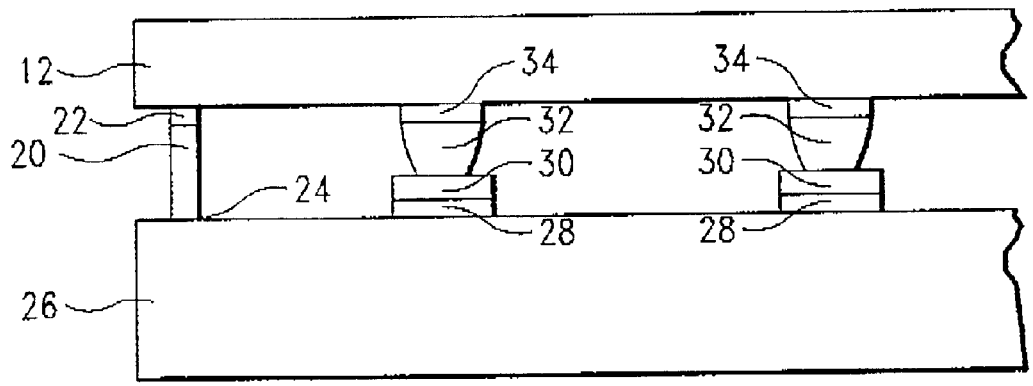

Thereafter, first substrate 12 is aligned (such as by optical alignment) with second substrate 26 such that reflowed solder balls 32 align with solder paste 30 and pads 28 as shown in FIG. 1C. According to the present invention, contact of reflowed solder balls 32 with solder paste 30 is not a problem, even with cambered substrates, because of the tolerance afforded by the solder paste 30 which can accommodate various degrees of penetration by the reflowed solder balls 32 directly in contact with it. Note that where standoff 20 is to come into contact with second substrate 26 at 24, no solder paste is applied as it is preferred that standoff 20 not be bonded to second substrate 26 because of stress considerations.

Figure 1D:
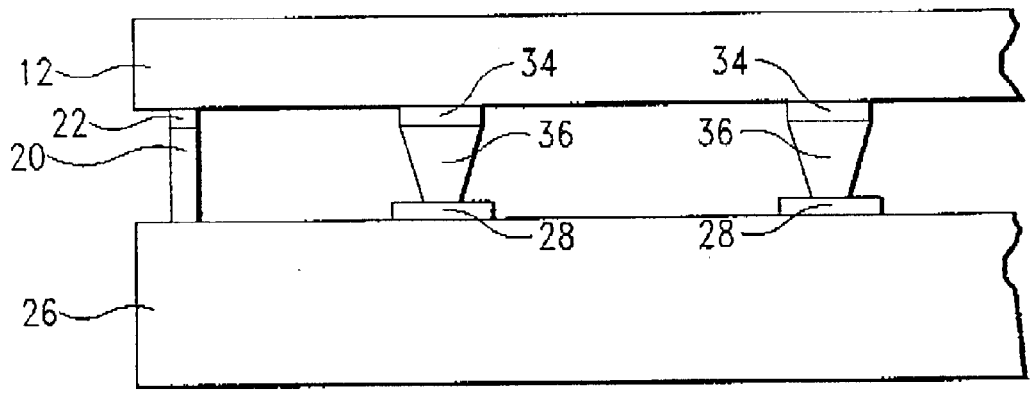

The first substrate 12 and second substrate 26 are held in juxtaposition and placed in the furnace as before. After reflow at 220–260° C., the joined first 12 and second 26 substrates are shown in FIG. 1D. Reflowed solder balls 32 and solder paste 30 have been replaced by solder columns 36.

Figure 2A:
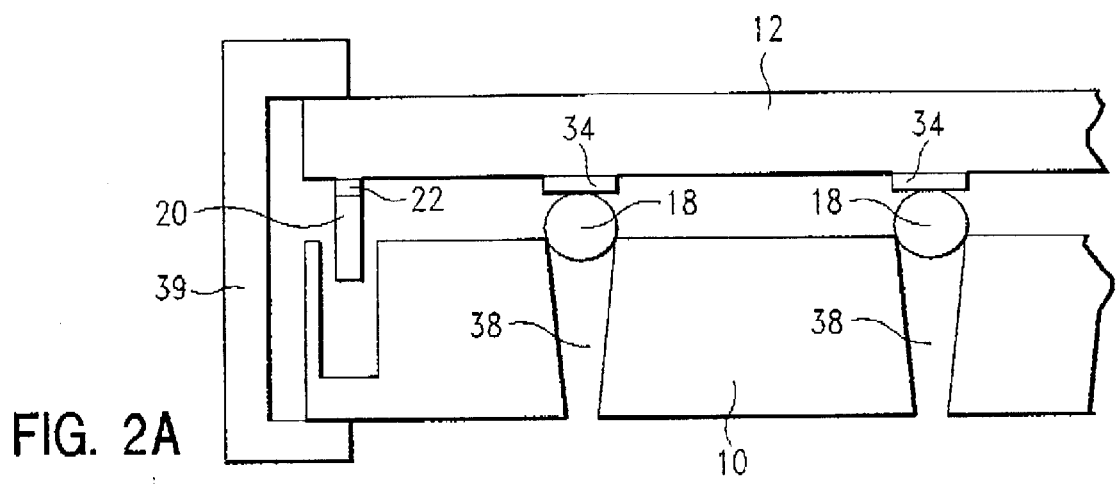
FIGS. 2A to 2D illustrate a second embodiment according to the present invention.
Figure 2B:
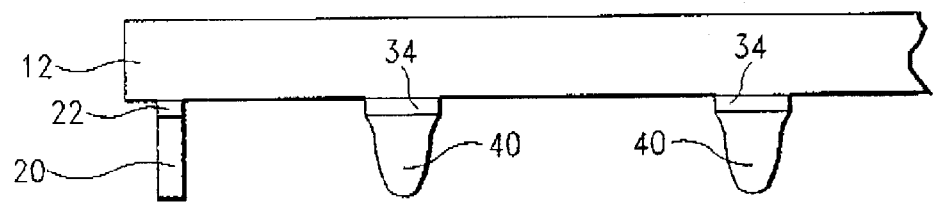
Figure 2C:
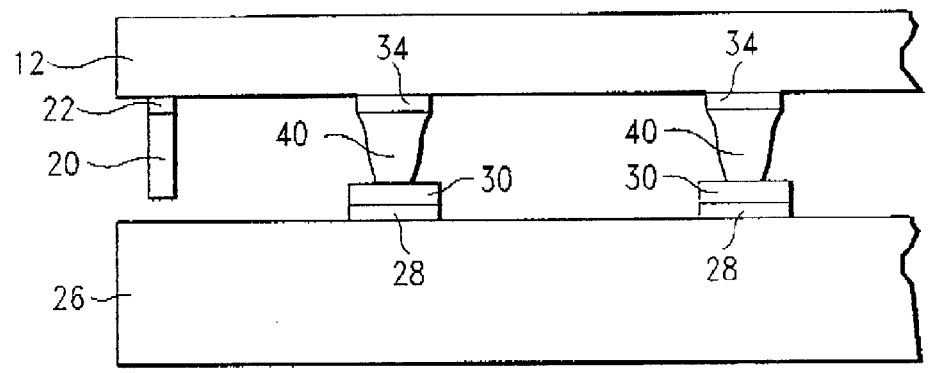
Figure 2D:
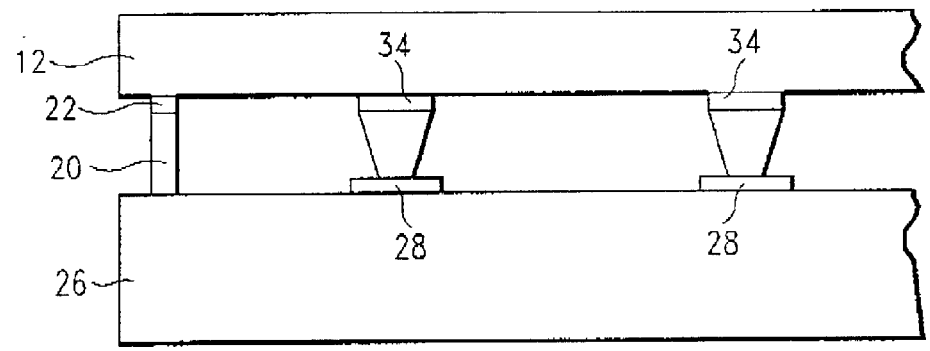

Referring now to FIGS. 2A to 2D, there is shown a second embodiment according to the present invention. The second embodiment is similar to the first embodiment except that cavities 38 in graphite boat 10 are both narrower and steeper so that upon clamping (such as by clamp 39) of the first substrate 12 to graphite boat 10 and reflow of solder balls 18, reflowed solder balls 40 are forced into cavities 38 so as to be elongated thus causing the height of reflowed solder balls 40 to be at least equal to, or greater than, the diameter of the solder balls 18 as shown in FIG. 2B. As an example of this second embodiment of the present invention, pads 34 on first substrate 12 would have a diameter of approximately 0.035 inches, the solder balls 18 would have a diameter of approximately 0.035 inches and the height of the reflowed solder balls 40 (as measured from the pad 34) would be approximately 0.035–0.038 inches. The elongated reflowed solder balls 40 allow greater standoff height and greater accommodation of cambered substrates.

In the above two embodiments of the present invention, it was disclosed that the standoffs 20 are joined to the first substrate 12 at the same time as the solder balls 18. It should be apparent to those skilled in the art that standoffs 20 could be joined to first substrate 12 either before or after the joining of solder balls 18 to the first substrate 12. Similarly, standoffs 20 could be joined to second substrate 26 and not joined to first substrate 12. Further, standoffs 20 could be joined to the second substrate 26 during or prior to the assembling of the first substrate 12 and second substrate 26 and reflowing of the respective solder components. Moreover, while solder balls 18 are preferred for the present invention, other solder elements such as solder columns may be used in place of solder balls 18.

It is noted that the reflowed solder balls 32 (as shown in FIG. 1B) are less than the height of the standoff 20. It is preferred, however, that the reflowed solder balls 40 (as shown in FIG. 2B) should be equal to or greater than the standoffs 20 in height which effect is achievable by the method according to the present invention.

The present inventors have found that there is a marked increase in reliability of lead-free solders according to the present invention. Thus, in accelerated thermal testing (0–100° C.), reliability of interconnections made according to the present invention increased from 50 to 125% compared to interconnections where no standoff is present. More specifically, for interconnections made according to the second embodiment of the present invention, reliability increased from 75 to 125%, with 100% improvement being typical, compared to interconnections where no standoff is present.

Figure 3:
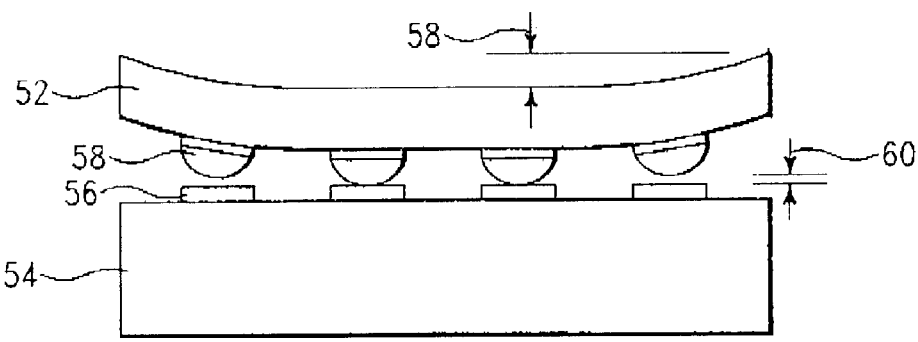
FIG. 3 illustrates the conventional joining of first and second substrates where at least one of the substrates has camber.

Referring now to FIG. 3, there is a prior art solution to joining first substrate 52 to second substrate 54. Because of camber 58 of first substrate 52, some of the solder balls 58 do not join some of the pads 56 (which may or may not have a low melt solder on them) as shown by gap 60. This may result in rejection of the assembly along with the attendant costs of reworking.

Figure 4:
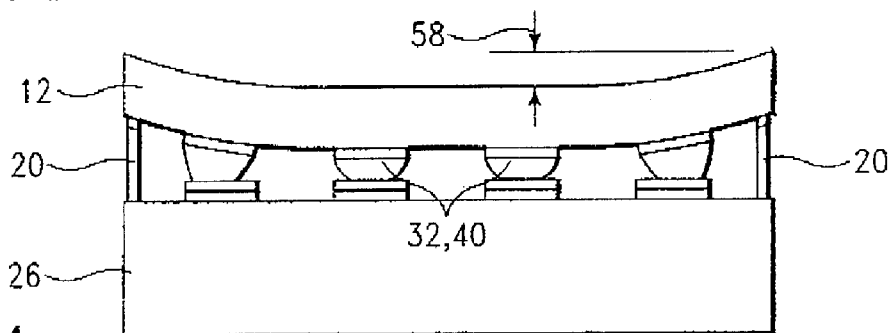
FIG. 4 illustrates the joining according to the present invention of first and second substrates where at least one of the substrates has camber.

Referring now to FIG. 4, there is shown the solution according to the present invention to joining first substrate 52 to second substrate 54. The present inventors have discovered that by providing standoffs 20 and making the solder paste 30 thick enough, camber 58 can be readily accommodated in the assembly of the first substrate 12 and second substrate 26 so that there is no gap between any adjacent pair of solder ball and pad. Moreover, in the electronic component industry there are limitations as to the thickness of solder paste 30. Typically, the limit on the thickness of the solder paste 30 is 0.008 inches or less. Both the first and second embodiments of the present invention can meet this industry limitation; however, the second embodiment of the present invention can allow a decrease in the thickness of solder paste 30 to below 0.008 inches because of the height of reflowed solder elements 40.

Figure 5A:
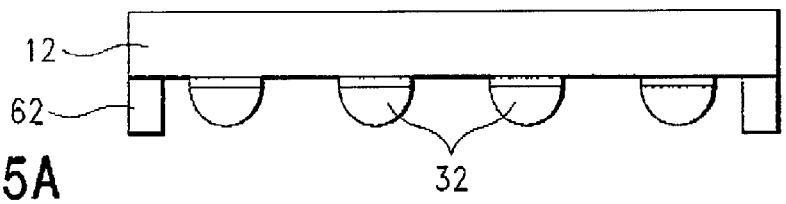
FIGS. 5A and 5B illustrate a first variation of the standoffs used in the present invention.
Figure 5B:
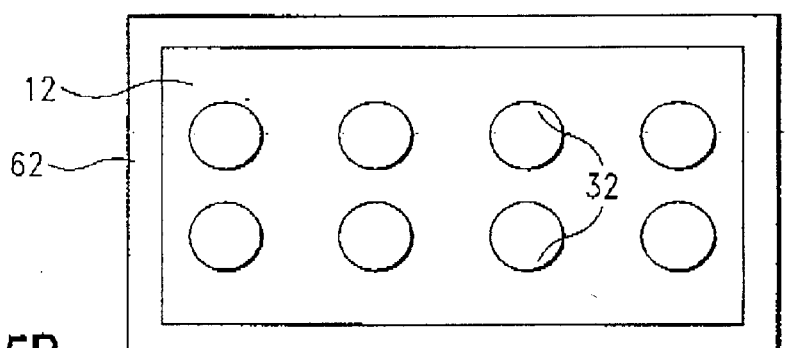
Figure 6:
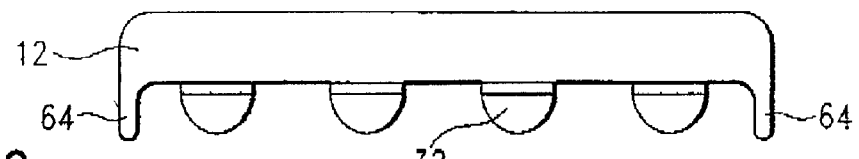
FIG. 6 illustrates a second variation of the standoffs used in the present invention.

While the standoffs 20 shown in FIGS. 1A–1D, 2A–2D and 4 are columns, the standoffs 20 may take other forms. As shown in FIGS. 5A and 5B, standoff 62 is essentially a frame that goes at least partly, and preferably entirely, around the perimeter of first substrate 12. As shown in FIG. 6, standoff 64 is a ridge at least partly, and at least entirely, along the perimeter of the first substrate 12 and may be integral to form a part of first substrate 12.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of joining first and second substrates through a solder element interconnect, the method comprising the steps of:
   obtaining a heat resistant boat having a plurality of cavities wherein each of the cavities has a first portion sized to receive a quantity of solder and a second portion narrower in cross section than the first portion;
   placing a quantity of solder in each of the first portion of the cavities;
   placing the first substrate in juxtaposition with the heat resistant boat so that the first substrate contacts each of the quantities of solder;
   clamping the first substrate to the heat resistant boat;
   heating the first substrate, heat resistant boat and quantities of solder so as to reflow the solder, the quantities of solder joining with the first substrate while also being forced into the second portion of each of the cavities so as to form a plurality of elongated solder elements in a first array on the first substrate;
   forming a plurality of pads of solder paste in a second array on a second substrate wherein the first and second arrays are mirror images of one another;
   establishing at least one standoff element on one of the first or second substrates;
   assembling the first and second substrates such that each of the solder elements on the first substrate are embedded in each of the solder paste pads and the at least one standoff element is interposed between the first and second substrates;
   heating the first and second substrates at a predetermined temperature to cause melting of the plurality of solder elements and the plurality of solder pads into single solder elements, the at least one standoff controlling the separation distance between the first and second substrates.

2. The method of claim 1 wherein the quantities of solder are solder balls having a diameter and wherein the elongated solder elements have a height that is equal to, or greater than, the diameter of the solder balls.

3. The method of claim 1 wherein the at least one standoff has first and second ends in contact with the first and second substrates, respectively, and wherein the standoff first end is joined to the first substrate while the standoff second end is not joined to the second substrate, the at least one standoff being permanently joined to the first substrate.

4. The method of claim 1 wherein the at least one standoff has first and second ends in contact with the first and second substrates, respectively, and wherein the standoff second end is joined to the second substrate while the standoff first end is not joined to the first substrate, the at least one standoff being permanently joined to the second substrate.

5. The method of claim 1 wherein the solder composition of the plurality of solder elements and the solder composition of the plurality of solder paste pads is the same composition.

6. The method of claim 5 wherein the solder composition is lead-free.

7. The method of claim 5 wherein the solder composition is selected from the group consisting of tin/silver alloys, tin/silver/copper alloys, tin/silver/bismuth alloys, tin/silver/bismuth/copper alloys, tin/antimony alloys and tin/bismuth alloys.

8. The method of claim 5 wherein the solder composition contains lead.

9. The method of claim 1 wherein the first and second substrates are organic substrates.

10. The method of claim 1 wherein the first substrate is a ceramic substrate and the second substrate is an organic substrate.

11. The method of claim 1 wherein at least one of the first and second substrates has camber and the thickness of the solder paste of the plurality of solder paste pads is equal to or greater than the amount of camber.

12. The method of claim 1 wherein the solder elements are solder balls.

13. The method of claim 1 wherein there are a plurality of standoffs.

14. The method of claim 1 wherein the solder elements and at least one standoff have a length and the length of the solder elements equals the length of the at least one standoff.

* * * * *